United States Patent [19]

Drehman

[11] Patent Number: 4,963,852
[45] Date of Patent: Oct. 16, 1990

[54] SUPERCONDUCTOR SWITCH

[75] Inventor: Alvin J. Drehman, Chelmsford, Mass.

[73] Assignee: The United States of America as represented by the Secretary of the Air Force, Washington, D.C.

[21] Appl. No.: 323,636

[22] Filed: Mar. 15, 1989

[51] Int. Cl.$^5$ ............... H01L 29/00; H01L 39/00
[52] U.S. Cl. ................... 338/32 S; 335/216; 505/1; 307/245
[58] Field of Search .............. 338/32 S; 335/216; 374/176, 177; 505/1; 307/245

[56] References Cited

U.S. PATENT DOCUMENTS

| | | | |
|---|---|---|---|
| 3,259,866 | 7/1966 | Miles et al. | 338/32 S |
| 3,383,758 | 5/1968 | Bremer | 29/599 |
| 3,466,470 | 9/1969 | Rowell | 307/306 |
| 3,706,064 | 12/1972 | Dynes et al. | 338/32 S |
| 3,707,670 | 12/1972 | Erdman | 323/96 |
| 3,715,703 | 2/1973 | Croso et al. | 338/32 S |
| 3,764,828 | 10/1973 | Croso et al. | 307/245 |
| 4,055,847 | 10/1977 | Fletcher et al. | 338/32 S X |
| 4,083,029 | 4/1978 | Lahizi | 338/32 S |
| 4,764,357 | 8/1988 | Sherif et al. | 505/1 |

OTHER PUBLICATIONS

Anderson, P. W. et al., "Radio-Frequency Effects in Superconducting Thin Film Bridges", *Physical Review Letters*, vol. 13, No. 6, 1964, pp. 195 to 197.

Primary Examiner—Bruce A. Reynolds
Assistant Examiner—Marvin M. Lateef
Attorney, Agent, or Firm—Stanton E. Collier; Donald J. Singer

[57] ABSTRACT

A current controlled superconducting switch has a current controlling constriction such that the level of the input determines the condition of the switch. A plurality of the superconducting switches are connected to produce a logic scheme.

4 Claims, 2 Drawing Sheets

SUPERCONDUCTOR SWITCH

STATEMENT OF GOVERNMENT INTEREST

The invention described herein may be manufactured and used by or for the Government for governmental purposes without the payment of any royalty thereon.

BACKGROUND OF THE INVENTION

The present invention relates to superconductor devices, and, in particular, to a superconducting switch.

It is know that, in order to cause a superconducting circuit to shift from the superconducting state to the normal-conducting state, either all or part of the circuit must be subjected to a magnetic field or to a temperature rise, the value of which exceeds that of the field or of the critical temperature. The circuit thus loses its superconducting properties and reverts to the normal state in which its electrical resistance, in particular, is no longer zero; in the case of a closed loop with an electric current flowing therein without loss of energy it thus becomes an open circuit. Similarly, by restoring the conditions of field and temperature to their initial state, the circuit is again completely closed in the same manner as a conventional arrangement which makes use of a mechanical switch or the like.

One type of superconducting switch is called a cryotron which comprises a gate-conductor film on the order of 0.3-1.0 micron thickness of soft superconductive material which is crossed by a narrow control-conductor film also on the order of 0.3-1.0 micron thickness insulated therefrom and preferably formed of hard superconductive material. Both the gate-conductor and the control-conductor are thus normally in the superconducting state. If sufficient current is caused to flow through the control-conductor, the resulting magnetic field causes the gate-conductor to become resistive in the region of the crossover.

Other types of superconductor switches use an interface region between two superconducting regions. The interfacial region may be formed in a variety of geometries including a superconductor, insulator barrier, superconductor (SIS); superconductor, normal metal, superconductor (SNS), point contact and bridge type structures. The interfacial region in each of the above cases is a weak-link region interconnecting the superconductive regions, the weak-link breaking down when a critical supercurrent is exceeded. The weak-link is the thin insulator in the SIS structure, the thin normal metal in the SNS structure, the region of contact in the point contact structure and the region of minimum cross-sectional area in the bridge structure.

When the current through the interface exceeds a first critical current, $I_c$, the voltage across the interface increases to some finite value. This voltage does not return to zero until a switchback current is reached.

The switching in the above devices is magnetically controlled.

SUMMARY OF THE INVENTION

The present invention is a superconducting switch that is current controlled.

The present invention is a single superconducting switch having a current source applied to an input, a second current source applied to a gate, the gate being on the source voltage side of the switch, a current controlled constriction, and a drain being the output of the switch. The current controlled constriction being between the input and output.

Therefore, one object of the present invention is to provide a superconducting switch that is current controlled.

Another object of the present invention is to provide a superconducting switch that may be interconnected on integrated circuits with other superconducting switches.

Another object of the present invention is a superconducting switch that avoids the complexities of the Josephson junction logic.

These and many other objects and advantages of the present invention will be readily apparent to one skilled in the pertinent art from the following detailed description of a preferred embodiment of the invention and the related drawings.

DETAILED DESCRIPTION OF THE PREFERRED EMBODIMENT

Figure 1:
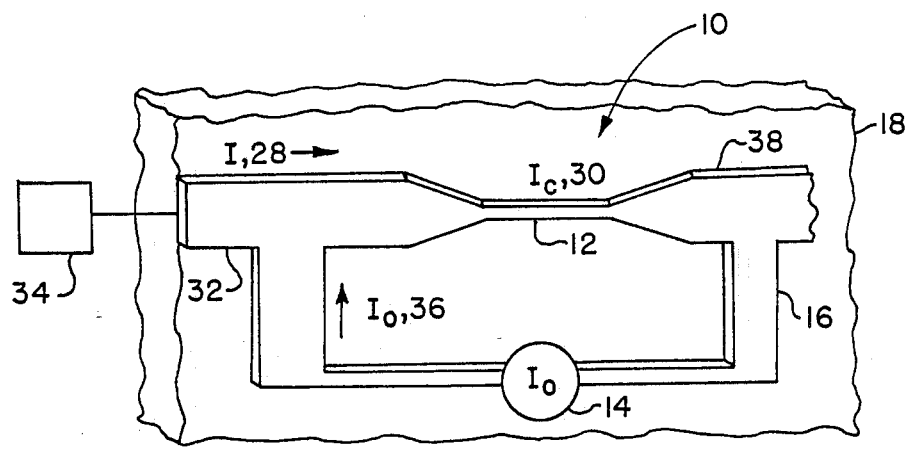
FIG. 1 schematically illustrates the operating principles of the present invention.
Figure 2:
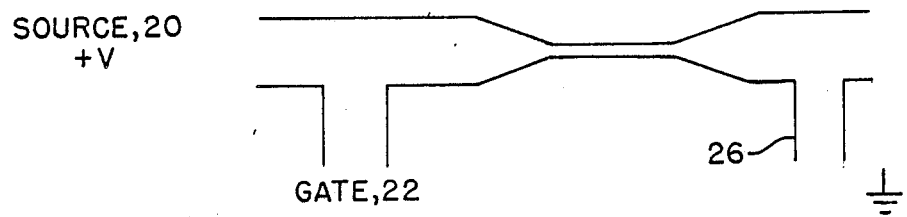
FIG. 2 illustrates by electronic terminology the present invention.

Referring to FIG. 1, a superconducting switch 10 is shown in schematic. Switch 10 may be constructed of a thin film, wire or ribbon of superconductor material such as a metal Niobium or Lead or a ceramic $Y_1Ba_2Cu_3O_7$. This thin film 16, for example, may be deposited on an insulating substrate 18 such as silicon. FIG. 2 illustrates the electronic switch 10 as having a source 20, a gate 22, a drain 24 and a ground 26.

Figure 5:
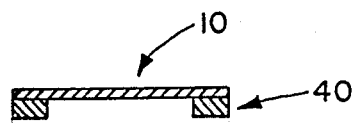
FIG. 5 illustrates in cross section a switch suspended by supporting device.

If the switch 10 is made from a ribbon, a flat section, a substrate is not needed except a supporting device 40 would hold switch 10 in suspension. See FIG. 5.

In FIG. 1, the switch 10 has an input 32, a constriction 12, an output 38 and a current source 14. A current I 28 flows through the input 32 while in the turned on condition. A critical current $I_c$ 30 is that current defined by $A = I_c/J_c$ where A is the cross sectional area of the constriction 12 and $J_c$ is the critical current density of the material in the constriction 12. The critical current $I_c$ 30 defines the current level above which the superconducting condition in the constriction 12 is turned off and a resistance, $R_n$, in constriction 12 occurs and below which the superconducting condition returns. The current carrying capacity is determined by the cross section A and the critical current density $J_c$ in the constriction 12.

To turn off the switch 10, a control current $I_o$ 36 is generated by the current source 14 wherein $I_o$ 36 is greater than $I_c$ 30. Source 14 may be a similar switch 10 outputting a current $I_o$.

Thus the switch 10 becomes normal at the constriction 12 resulting in a voltage appearing thereacross. With appropriate current sources for I 28 and $I_o$ 36 it is not necessary that $I_o$ 36 exceed $I_c$ 30, rather only that I 28 + $I_o$ 36 exceed $I_c$ 30 to turn the switch 10 off.

Because a device 34 providing the current I 28 has a maximum voltage, the current flowing through the constriction 12 is reduced in the normal (non-superconducting) state, i.e., when the switch 10 is off. This normal current $I_n$ is given by $I_n = V/R_n$ where V is the available voltage from the current source 14 (1 microvolt to 1 volt for example), and $R_n$ is the normal resistance of the constriction 12 and is in the range of 1 ohm to 1 megohm. By proper selection of the material, A and V, the off current $I_n$ is much less than I 28.

In the case that I 28 and $I_o$ 36 are the same, then another switch 10 can control switch 10. Clearly, in this case $2I > I_c > I$ must hold. This gives a working range for I of $0.5\ I_c < I < I_c$.

Figure 3:
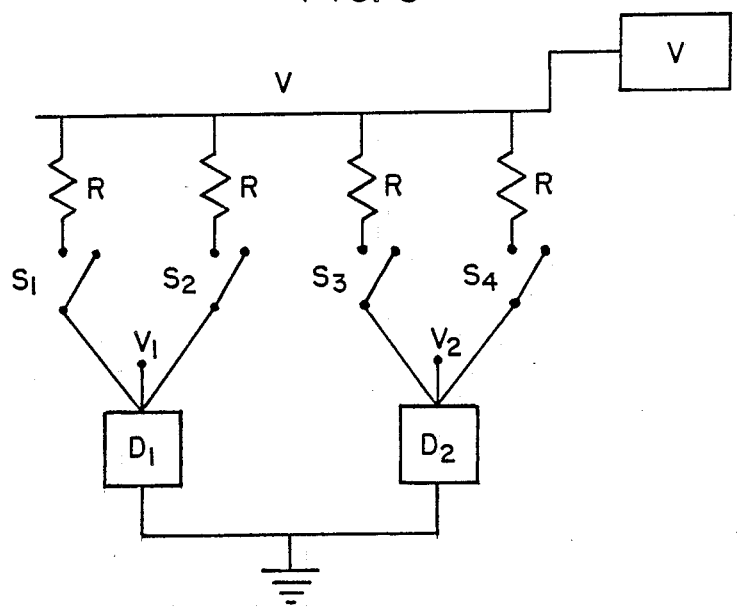
FIG. 3 illustrates a parallel combination of the superconducting switches.
Figure 4:
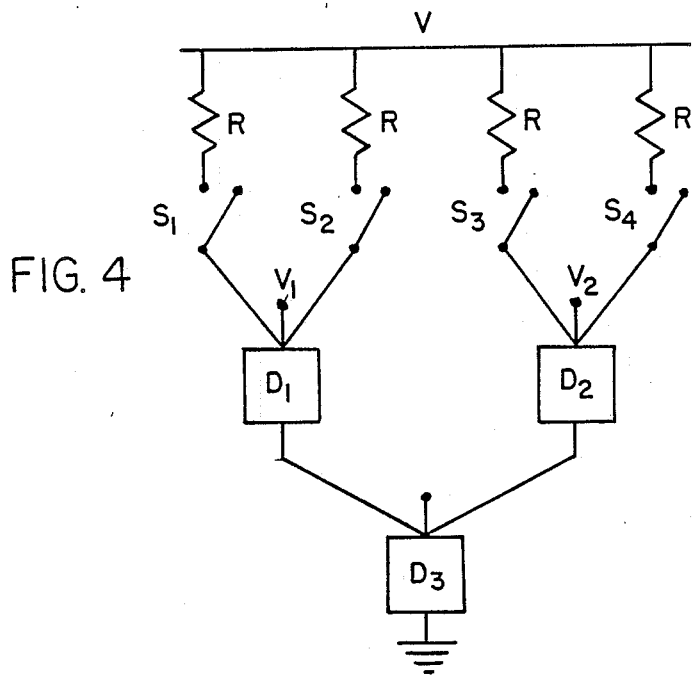
FIG. 4 illustrates a parallel-serial combination of the superconducting switches.

In order to more fully disclose the operation of the switch 10, reference is made to FIGS. 3 and 4.

As seen in FIG. 3, a voltage V is applied to parallel resistors R. Each resistor R is connected to a switch $S_i$, that is externally controlled and each pair of switches, $S_i$ and $S_i + 1$ are connected to a superconducting switch, $D_i$. V and R are selected such that $V/R \cong 0.7\ I_c$ where R is much less than the normal state resistance of superconducting switch, $D_i$. (For example, $Rn \pm 100\ R$). $V_i$ is only used to indicate a voltage point. Table 1, partially, displays the various logic states.

TABLE 1

| $S_1$ | $S_2$ | $S_3$ | $S_4$ | $V_1$ | $V_2$ |
|---|---|---|---|---|---|
| O | O | O | O | L | L |
| C | C | C | O | H | L |
| O | C | C | C | L | H |
| O | C | C | O | L | L |
| C | C | C | C | H | H |

O = Open, C = Closed, L = Low and H = High

FIG. 4 illustrates the scheme where $D_3$ is connected in series with $D_1$ and $D_2$. Table 2 illustrates the various logic states.

TABLE 2

| $S_1$ | $S_2$ | $S_3$ | $S_4$ | $V_1$ | $V_2$ | $V_3$ |
|---|---|---|---|---|---|---|
| O | O | O | O | L | L | L |
| C | C | O | O | H | L | L |
| C | O | O | O | L | L | L |
| C | O | C | O | H | H | H |
| C | C | C | O | H | H | H |
| C | C | C | C | H | H | H |

Clearly, many modifications and variations of the present invention are possible in light of the above teachings and it is therefore understood, that within the inventive scope of the inventive concept, the invention may be practiced otherwise than specifically claimed.

What is claimed is:

1. A current controlled superconducting switch, said current controlled superconducting switch comprising, means for supporting, said means for supporting being an insulating material; an input, said input connected to a device for providing an input current and having a voltage limit, said input being a superconducting material, a current I from the device flowing through said input when said switch is "on", and a substantially reduced current flowing through said input when said switch if "off";
a current controlling constriction, being a non-weak link, said constriction being superconducting when a current flowing therethrough is less than the critical current of said constriction, and non-superconducting when the current flowing exceeds the critical current;
a means for inputting a control current, said means being superconducting, said means being connected to said input, said control current and said input current from said device flowing through said constriction, and
an output, said output being superconducting, said output connected to said constriction, said means for inputting and said output being supported by said means for supporting.

2. A current controlled superconducting switch as defined in claim 1 wherein said material is selected from the group consisting of Niobium, Lead and $Y_1Ba_2Cu_3O_7$.

3. A current controlled superconducting switch, said current controlled superconducting switch comprising:
a substrate, said substrate being an insulating material;
an input, said input connected to a device for providing an input current and having a voltage limit, said input being a superconducting material, a current I from the device flowing through said input when said switch is "on", and a substantially reduced current flowing through said input when said switch is "off",
a current controlling constriction, being a non-weak link said constriction being superconducting when a current flowing therethrough is less than the critical current of said constriction, and non-superconducting when the current flowing exceeds the critical current;
a means for inputting a control current, said means being superconducting, said means being connected to said input, said control current and said input current from said device flowing through said constriction; and
an output, said output being superconducting, said output connected to said constriction said input and said output being supported by said substrate.

4. A current controlled superconducting switch as defined in claim 3 wherein said material is selected from the group consisting of Niobium, Lead and $Y_1Ba_2Cu_3O_7$.

* * * * *